(12) United States Patent
Jeon et al.

(10) Patent No.: US 7,271,061 B2
(45) Date of Patent: Sep. 18, 2007

(54) METHOD OF FABRICATING NON-VOLATILE MEMORY

(75) Inventors: Hee-Seog Jeon, Gyeonggi-do (KR); Seung-Beom Yoon, Gyeonggi-do (KR); Jeong-Uk Han, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 139 days.

(21) Appl. No.: 11/187,424

(22) Filed: Jul. 21, 2005

(65) Prior Publication Data

US 2006/0062069 A1 Mar. 23, 2006

(30) Foreign Application Priority Data

Sep. 22, 2004 (KR) .................... 10-2004-0075907

(51) Int. Cl.
*H01L 21/336* (2006.01)
(52) U.S. Cl. .................... 438/257; 438/264
(58) Field of Classification Search ................ 438/257, 438/264
See application file for complete search history.

(56) References Cited

U.S. PATENT DOCUMENTS 5,073,513 A * 12/1991 Lee ............................ 438/267
6,388,293 B1 * 5/2002 Ogura et al. ................ 257/365
6,420,233 B1 * 7/2002 Hsieh et al. ................ 438/257
6,486,509 B1 * 11/2002 Van Houdt .................. 257/319
6,635,533 B1 * 10/2003 Chang et al. ............... 438/259
6,727,545 B2   4/2004 Wang et al.
2006/0202255 A1 * 9/2006 Jeon et al. .................. 257/315

FOREIGN PATENT DOCUMENTS

KR          0152496          6/1998

OTHER PUBLICATIONS

Jan Van Houdt, et al. "A Low-Cost Poly-Sidewall Erase HIMOS™ Technology For 130-90nm Embedded Flash Memories" IMEC, Kapeldreef 75, B3001 Leuven, Belgium, 2 pages.

* cited by examiner

*Primary Examiner*—Evan Pert
(74) *Attorney, Agent, or Firm*—Marger Johnson & McCollom, P.C.

(57) ABSTRACT

In one embodiment, a semiconductor device includes a semiconductor substrate having a first junction region and a second junction region. An insulated floating gate is disposed on the substrate. The floating gate at least partially overlaps the first junction region. An insulated program gate is disposed on the floating gate. The program gate has a curved upper surface. The semiconductor device further includes an insulated erase gate disposed on the substrate and adjacent the floating gate. The erase gate partially overlaps the second junction region.

35 Claims, 8 Drawing Sheets

METHOD OF FABRICATING NON-VOLATILE MEMORY

CROSS REFERENCE TO RELATED APPLICATIONS

This application claims priority from Korean Patent Application 2004-0075907, filed on Sep. 22, 2004, the content of which is hereby incorporated by reference for all purposes.

BACKGROUND

1. Field of the Invention

This disclosure relates to semiconductor devices, and more particularly, to a non-volatile memory such as an EEPROM (Electrically Erasable and Programmable Read Only Memory) and method of manufacturing the same.

2. Description of the Related Art

Figure 1:
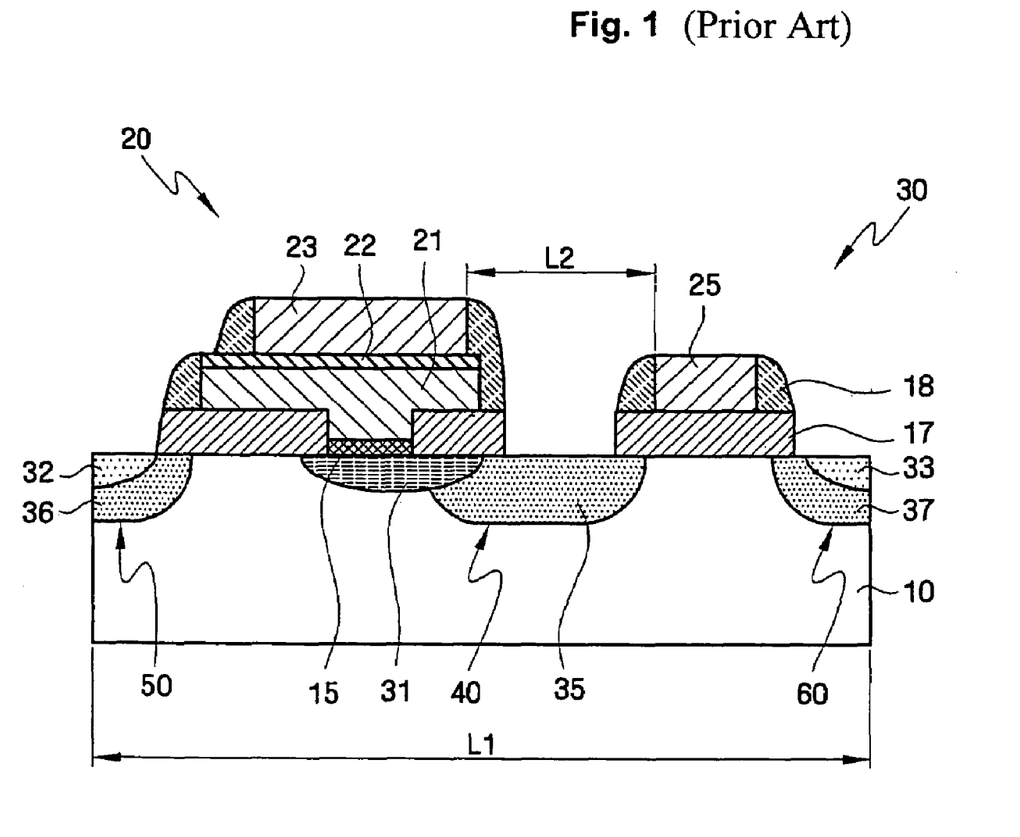
FIG. 1 is a sectional diagram illustrating a conventional EEPROM unit cell.

FIG. 1 is a sectional diagram illustrating the structure of a conventional EEPROM unit cell, which has been introduced to overcome the problems such as disturbance between adjacent memory cells, which can result in unintended program or erase operations of the adjacent memory cells.

Referring to FIG. 1, the conventional EEPROM unit cell consists of a memory transistor 20 and a select transistor 30 disposed on a substrate 10. The substrate 10 includes a common source region 50 and a drain region 60. The source region 50 includes a double diffusion structure including an n$^+$ type high concentration impurity region 32 and an n$^-$ type low concentration impurity region 36. Likewise, the drain region 60 includes a double diffusion structure including an n$^+$ type high concentration impurity region 33 and an n$^-$ type low concentration impurity region 37. The length L1, or the distance between the source region 50 and the drain region 60, is the width of the conventional EEPROM unit cell.

The substrate 10 also includes a channel region 40 that consists of an n$^-$ type low concentration impurity region 35. An n$^+$ type high concentration impurity region 31 is disposed adjacent to the channel region 40, beneath the memory transistor 20.

The memory transistor 20 consists of a tunneling dielectric 15, a gate dielectric 17, a floating gate 21, an intergate insulating layer 22, a sense line 23, and spacers 18 disposed on the sidewalls of the floating gate 21, the intergate insulating layer 22, and the sense line 23.

The select transistor 30 consists of a word line 25 insulated from the substrate 10 by a gate dielectric 17. In addition, spacers 18 are disposed on the sidewalls of the word line 25. The length L2 is the distance between the sense line 23 and the word line 25. The conventional EEPROM unit cell overcomes the disturbance problem using the word line 25 which prevents the unintended program or erase operations of the nearby cells. Thus, with the conventional EEPROM unit cell, the sense line 23 and the word line 25 are required to be formed together.

Table 1 below illustrates the voltages that are applied to the conventional EEPROM unit cell during a charge, discharge, and read operation.

TABLE 1

| Operation Status | Sense Line 23 | Word Line 25 | Source region 50 | Drain region 60 | Substrate 10 |
| --- | --- | --- | --- | --- | --- |
| Charge (erase) | 15 V | 17 V | Floating | 0 V | 0 V |
| Discharge (program) | 0 V | 17 V | Floating | 15 V | 0 V |
| Read | 1.8 V | 1.8 V | 0 V | 0.5 V | 0 V |

During a charge or erase operation, a voltage of 15 V is applied to the sense line 23 and a voltage of 17 V is applied to the word line 25. The source region 50 is kept in a floating state while both the drain region 60 and substrate 10 are at a potential of 0 V. Fowler-Nordheim (F-N) tunneling occurs from the channel region 40 to the floating gate 21, having the effect of increasing the threshold voltage $V_{th}$ of the device.

During a discharge or program operation of the device, a voltage of 0 V is applied to the sense line 23 and a voltage of 17 V is applied to the word line 25. The source region 50 is kept in a floating state while the drain region 60 has a voltage of 15 V applied to it, and the substrate 10 is held at 0 V. F-N tunneling occurs from the floating gate 21 to the channel region 40, having the effect of decreasing the threshold voltage $V_{th}$ of the device.

During a read operation of the device, the "1" or "0" status of the device is read by sensing the charged or discharged status of the device. Both the sense line 23 and the word line 25 are maintained at a read voltage of about 1.8 V, while the drain region 60 is maintained at about 0.5 V. The source region 50 and the substrate 10 are at about 0V.

Disadvantages of the conventional EEPROM unit cell described above include that it has a relatively slow speed due to the F-N tunneling processes that occur during both the charge and discharge operations. Furthermore, both the sense line 23 and the word line 25 must be physically separated by a sufficient amount, thus the conventional EEPROM unit cell has a relatively large size, e.g., L1. Furthermore, it is difficult to reduce L1 because sufficient overlap margins between the impurity region 31 and the floating gate 21 need to be secured. As a result, additional reduction of the device sizes has become more difficult.

In addition, as the semiconductor devices have become more highly-integrated, the prior art problems such as punchthrough or program disturbance between the memory cells have become more serious. This is particularly true as the high voltages need to be applied to the junction regions for an F-N tunneling of electrons through the tunneling dielectric layer 15 during the program operation or the erase operation.

Embodiments of the invention address these and other disadvantages of the conventional art.

SUMMARY

Embodiments of the invention include a non-volatile memory cell that has an erase gate formed through a self-aligned process, thereby reducing the size of the resulting cell compared to conventional EEPROM cells manufactured with a photolithographic process.

In one embodiment, a semiconductor device includes a semiconductor substrate having a first junction region and a second junction region. An insulated floating gate is disposed on the substrate. The floating gate partially overlaps the first junction region. An insulated program gate is disposed on the floating gate. The program gate has a curved upper surface. The semiconductor device further includes an insulated erase gate disposed on the substrate and adjacent the floating gate. The erase gate partially overlaps the second junction region.

DETAILED DESCRIPTION

In the following description, several exemplary embodiments of the invention are described. These exemplary embodiments are not intended to be limiting in any way, but rather to convey the inventive aspects contained in the exemplary embodiments to those skilled in this art. Those skilled in this art will recognize that various modifications may be made to the exemplary embodiments without departing from the scope of the invention as defined in the attached claims.

Figure 2:
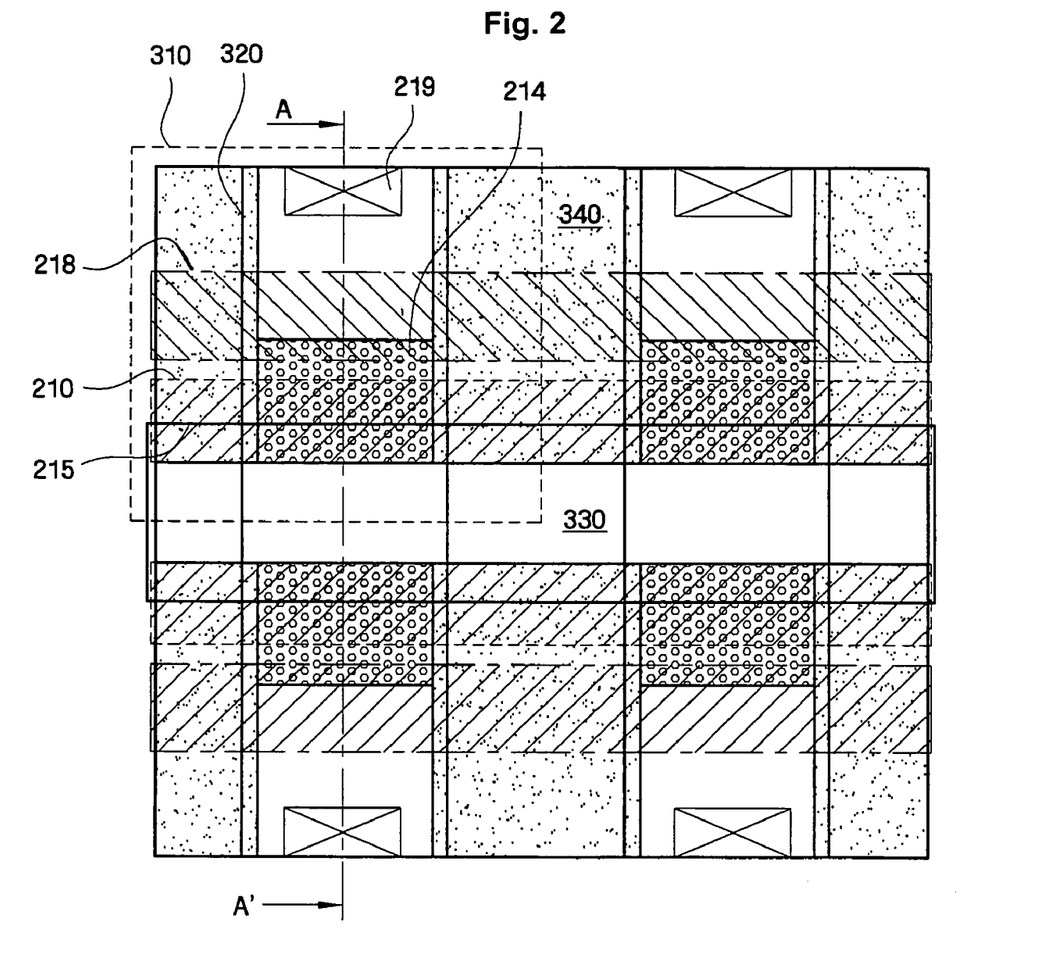
FIG. 2 is a plan diagram illustrating some features of an array of EEPROM unit cells in accordance with some embodiments of the invention.

FIG. 2 is a diagram illustrating some features of an array of EEPROM unit cells in accordance with an embodiment of the invention. While the features illustrated in FIG. 2 are out of necessity represented on a single sheet of paper, the features that are illustrated do not necessarily occupy the same horizontal plane.

Referring to FIG. 2, a pair of bit lines 320 are shown. The line A-A' bisects one of the bit lines 320 along the length of the bit line 320. The line A-A' also bisects the rectangular region, the rectangular region defining an area that contains an EEPROM unit cell 310.

Drain regions 219 are disposed on either side of a first impurity region or source region 215, the source region disposed such that a lengthwise direction of the source region 215 is substantially orthogonal with respect to a lengthwise direction of the bit lines 320. In other words, the source region 215 is arranged orthogonally with respect to the bit lines 320. Isolation regions 340, which are represented by the randomly dotted areas, define an active region 330.

An erase gate 218 and a program gate 210 may extend lengthwise in the same direction as the source region 215. Furthermore, floating gates 214, indicated by the regions having the uniformly-spaced circles, are disposed such that they are overlapped by the erase gate 218 and partially overlapped by the program gate 210. However, as illustrated in FIG. 3, the floating gate 214 needs not overlap the erase gate 218.

Figure 3:
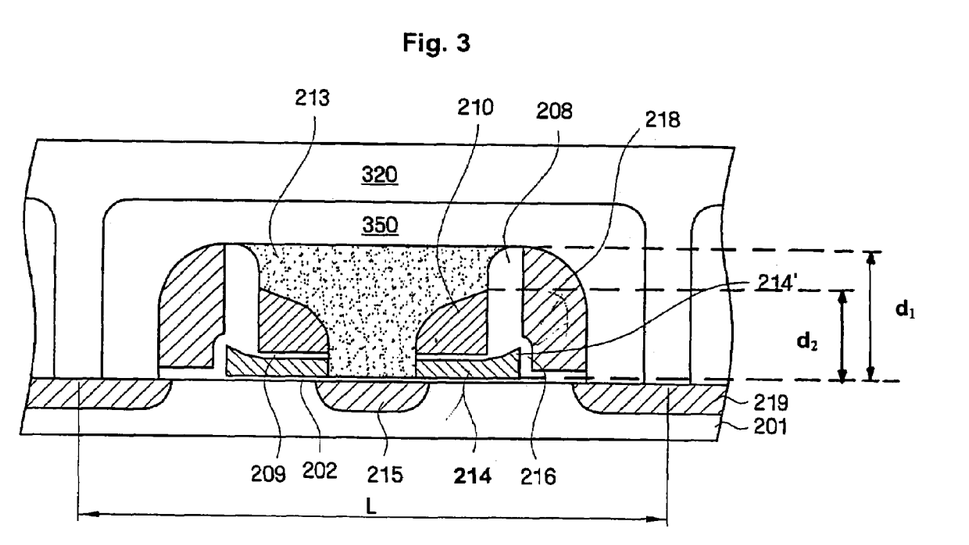
FIG. 3 is a sectional diagram that illustrates additional features of the EEPROM unit cells of FIG. 2.

FIG. 3 is a sectional diagram that illustrates additional features of the EEPROM unit cells of FIG. 2. FIG. 3 is a sectional diagram taken along A-A' line of FIG. 2.

Referring to FIG. 3, the drain regions 219 and source region 215 are formed in a substrate 201 such as a silicon substrate, silicon on insulator (SOI), GaAs substrate, SiGe substrate, or glass substrate, using conventional techniques such as ion implantation. The bit line 320 contacts the drain region 219 through contact holes formed in an interlayer dielectric layer 350. The floating gates 214 are separated from the substrate 201 by a gate dielectric layer 202, and the program gates 210 are separated from the floating gates by a coupling dielectric layer 209. The floating gates 214 include tips 214' that protrude upwards toward the erase gates 218, but are separated from the erase gates 218 by a tunneling dielectric layer 216. As an electric field is concentrated on the tip 214', an F-N tunneling process can occur even with low voltages during an erase operation which will be explained further below.

A dielectric sidewall 208 is disposed between each program gate 210 and each erase gate 218.

The distance L between the centers of the drain regions 219 spans the length of two EEPROM unit cells, each unit cell including a program gate 210, a floating gate 214, and an erase gate 218. As shown in FIG. 3, a dielectric material 213 is disposed between adjacent unit cells 310. The dielectric sidewalls 208, the program gates 210, and the erase gates 218 have curved upper surfaces. That is, one of the surfaces of the dielectric sidewalls 208, the program gates 210, and the erase gates 218 may progresses smoothly from a substantially vertical orientation to a near horizontal or substantially horizontal orientation.

FIGS. 4a-4m are sectional diagrams illustrating a method of manufacturing the EEPROM unit cells of FIGS. 2 and 3 in accordance with some embodiments of the invention. FIGS. 4a-4m have the same perspective as FIG. 3, that is, they are cross-sectional diagrams taken along line A-A' of FIG. 2.

Figure 4A:
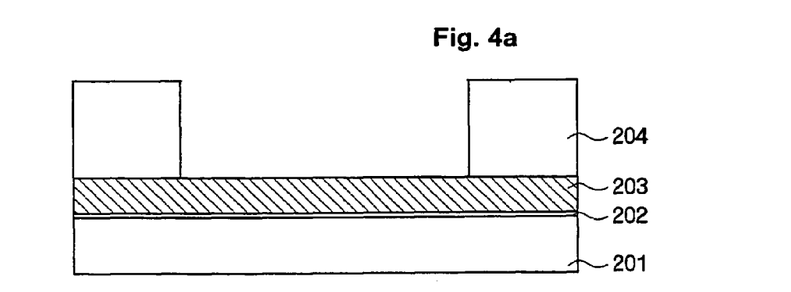
FIGS. 4a-4m are sectional diagrams illustrating a method of manufacturing the EEPROM unit cells of FIGS. 2 and 3 in accordance with some embodiments of the invention.

Referring to FIG. 4a, a gate dielectric layer 202 is formed on a substrate 201. The gate dielectric layer 202 may be formed of a thermal oxide having a thickness of about 50 to 150 Å. Alternatively, other dielectric materials such as high-k dielectric materials can be used to form the gate dielectric layer 202.

Next, a floating gate layer 203 is deposited on the gate dielectric layer 202 to a thickness of about 500 to about 1500 Å. Preferably, the floating gate layer 203 comprises polysilicon.

Subsequently, a dielectric layer (not shown) is deposited on the floating gate layer 203 to a thickness of about 2000 to 4000 Å. Preferably, the dielectric layer comprises a nitride. Then the dielectric layer is patterned to form a dielectric layer pattern 204 that exposes a portion of the floating gate layer 203.

Figure 4B:
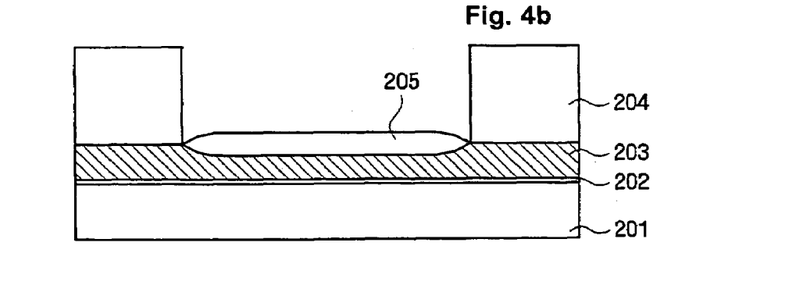

Referring to FIG. 4b, a thermal oxide layer 205 is formed (grown) on the exposed floating gate layer 203 through a thermal oxidation process. Preferably, the thermal oxide layer 205 has a thickness of about 500 to 1500 Å. As shown in FIG. 4b, the thickness of the thermal oxide layer 205 tends to taper towards a point in the regions adjacent to the dielectric layer pattern 204.

Figure 4C:
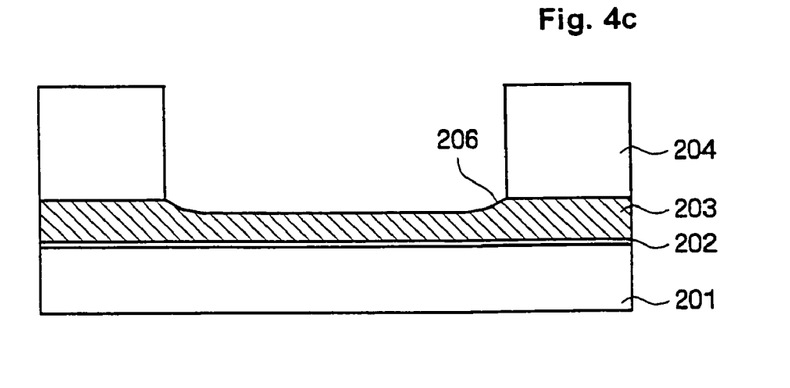

Referring to FIG. 4c, the thermal oxide layer 205 is removed, preferably by a wet-etching process, creating an upper surface of the floating gate layer 203 that curves upwardly in a region 206 adjacent to the dielectric layer pattern 204. In other words, the thermal oxide layer 205 is removed to form a substantially rounded region 206 of the floating gate layer 203 adjacent to a sidewall of the dielectric layer pattern 204.

Figure 4D:
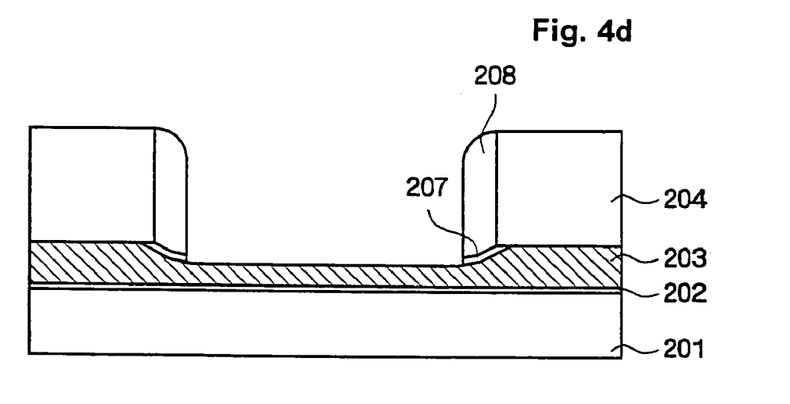

Referring to FIG. 4d, since the upper surface of the floating gate layer 203 in the regions 206 may have surface defects, which can lead to a charge loss, an optional thermal oxide layer 207 may be formed on the regions 206. In other words, the optional thermal oxide layer is formed on the rounded region of the floating gate layer 203. Preferably, the thickness of the thermal oxide layer 207 is about 50 to about 150 Å. Next, a dielectric sidewall 208 is formed on the thermal oxide layer 207 and in contact with a sidewall of the dielectric layer pattern 204. The dielectric sidewall 208 may be formed by depositing a dielectric material using a chemical vapor deposition (CVD) process, or by a thermal oxidation process at high temperature such as about 850° C. or above to create a high temperature oxide (HTO). Then, the dielectric material may be anisotropically etched or etched back to produce the dielectric sidewall 208 having a surface that curves smoothly from a substantially vertical orientation to a substantially horizontal orientation. Preferably, the lateral or side-to-side thickness of the dielectric sidewall 208 is about 500 to 1500 Å. The dielectric sidewall 208 is used as an isolation layer between a program gate and an erase gate, which are formed in subsequent processes.

Figure 4E:
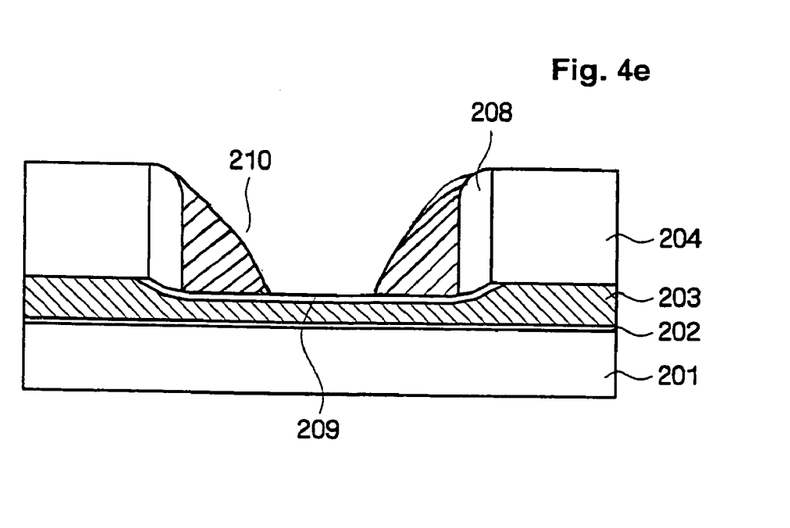

Referring to FIG. 4e, a coupling dielectric layer 209 is formed on the exposed surface of the floating gate layer 203. Preferably, the coupling dielectric layer may be formed to about the same thickness as the thermal oxide layer 207. The coupling dielectric layer 209 may be formed though a thermal oxidation process, through a CVD process using a HTO, or through the combination of a thermal oxidation process and a CVD process using a medium-temperature oxide (MTO), where a medium temperature is in the range of about 750° C.-about 850° C. Next, the program gates 210 are formed to a thickness of about 1500 to 3000 Å. Preferably, the program gates 210 are created by depositing polysilicon in the region between the dielectric sidewalls 208 using, for example, a CVD process. Then the polysilicon is anisotropically etched or etched back to produce the program gates 210 that have surfaces that curve from a substantially vertical orientation to a sloped orientation on the upper part of the program gate 210.

Figure 4F:
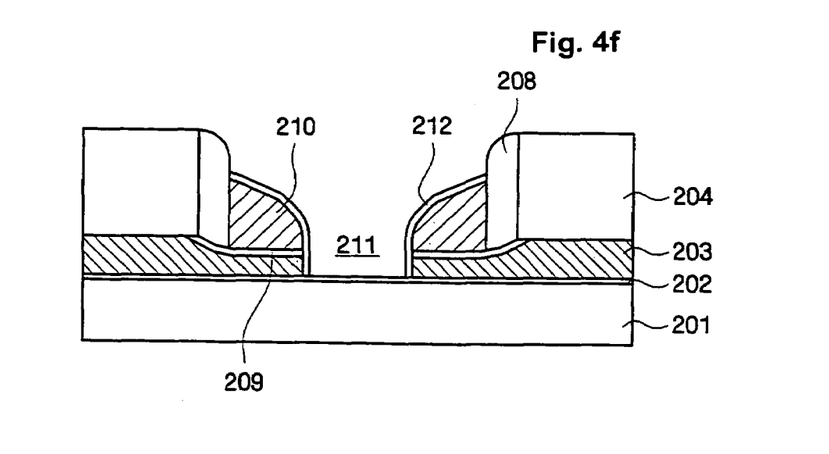

Referring to FIG. 4f, portions of the coupling dielectric layer 209 and the floating gate layer 203 are removed, using either a wet-etching process or a dry-etching process, until a portion of the gate dielectric layer 202 is exposed. Coincidentally, the program gates 210 may be etched to an additional extent at this point, further reducing the height of the program gates compared to what is illustrated in FIG. 4e. This etching produces a trench region 211. Next, an optional thermal oxide layer 212 may be formed to protect the exposed surfaces of the program gate 210. Preferably, the thickness of the thermal oxide layer 212 is about 50 to 150 Å.

Figure 4G:
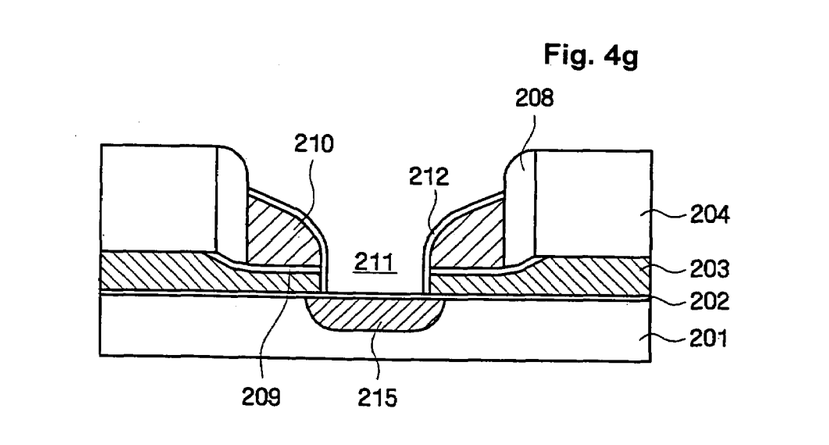

Referring to FIG. 4g, an ion-implantation process is performed in the trench region 211, preferably at a dose of, for example, about $1 \times 10^{15}$ ions/cm$^2$ using impurities such as As or P. This process results in an impurity region such as a common source region 215 within the substrate 201. This common source region 215 can be expanded during the subsequent heat treatment process and overlaps with at least a portion of the floating gate 214. Coincidentally, the program gates 210 may also be doped with ion impurities at this time. Outer portions of the common source region 215 may be disposed directly beneath portions of the floating gate layer 203. Optionally, the common source region 215 may include a halo region (not shown), which may be helpful for preventing punchthrough between adjacent memory cells or for generating electrons from the drain 219 region toward the common source region 215 during a write operation.

Figure 4H:
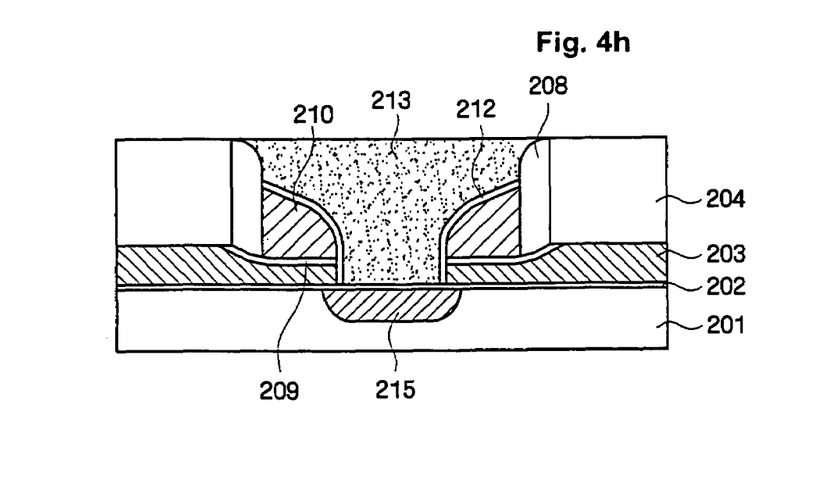

Referring to FIG. 4h, a dielectric material 213 is deposited to fill the trench region 211 and to cover the upper surfaces of the dielectric layer pattern 204. The dielectric material 213 is preferably deposited to a thickness of about 5000 to 10000 Å using a CVD process. The dielectric material 213 may comprises an oxide. Next, a chemical-mechanical polishing (CMP) process is performed on the dielectric material 213 until the upper surfaces of the dielectric layer pattern 204 are exposed.

Figure 4I:
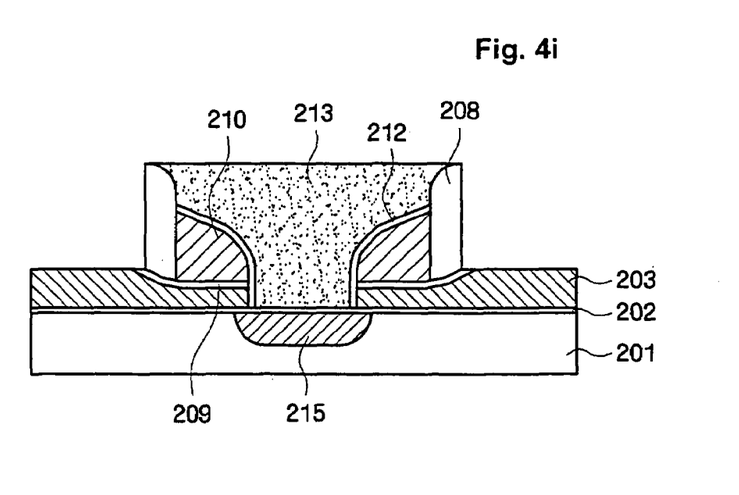

Referring to FIG. 4i, the dielectric layer pattern 204 is removed to expose portions of the floating gate layer 203. When the dielectric layer pattern 204 is formed of a nitride, a phosphoric acid is preferably used as the etchant.

Figure 4J:
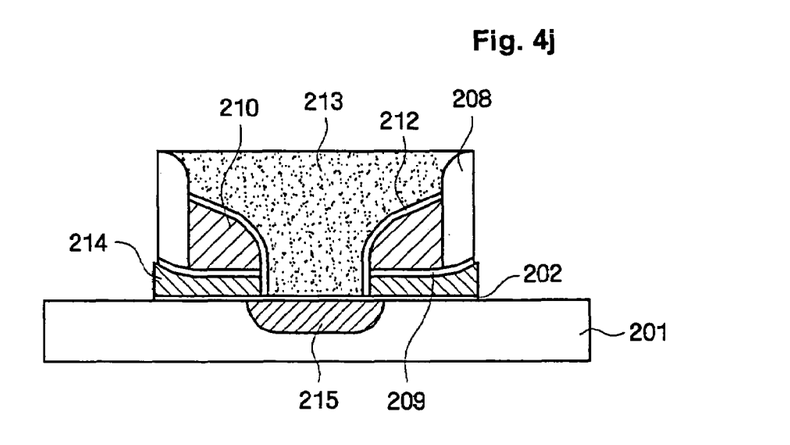

Next, referring to FIG. 4j, exposed portions of the floating gate layer 203 are etched, using the structure shown in FIG. 4i as an etch mask. Preferably, anisotropic dry etching is used to remove the exposed portions of the floating gate layer 203. This process produces floating gates 214 from the remaining portions of the floating gate layer 203. After this etching, portions of the gate dielectric layer 202 may remain uncovered by the floating gates 214. Next, these portions of the gate dielectric layer 202 are removed. Optionally, part of the coupling dielectric layer 209 is also removed during this process. As a result, a tip 214' of the floating gate 214 is exposed.

Figure 4K:
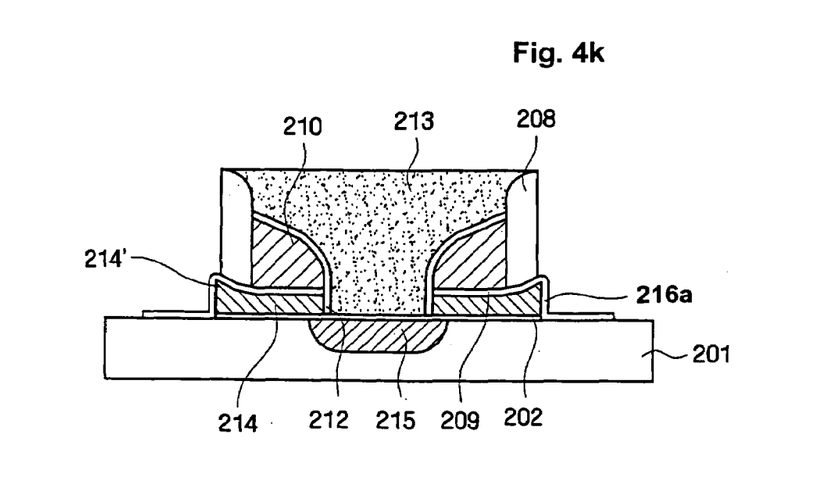

Referring to FIG. 4k, a tunneling dielectric layer 216a is formed on the tip 214' of the floating gate 214 and on a portion of the exposed semiconductor substrate 201. The tunneling dielectric layer 216a may be formed using a thermal oxidation process and has a thickness of about 50 to about 150 Å.

Figure 4L:
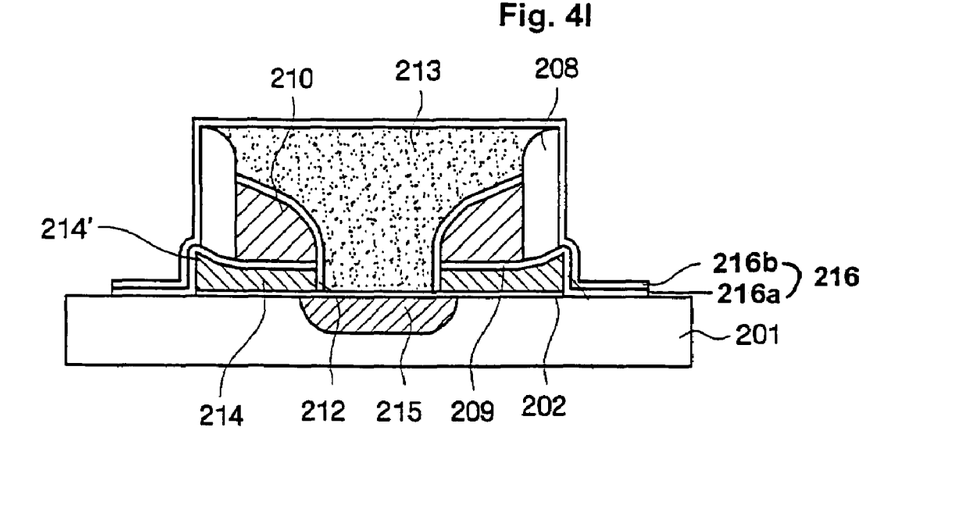

Referring to FIG. 4l, an additional tunneling dielectric layer such as an oxide layer 216b is formed to cover the resultant structure shown in FIG. 4k including the dielectric layer 216a. The oxide layer 216b may be formed using a CVD process. The additional thickness of the oxide layer 216b improves the characteristics of the dielectric layer 216a. Comparing FIG. 3 to FIG. 4l, it should be apparent that the tunneling dielectric layer 216 of FIG. 3 may be composed of both the dielectric layer 216a and the oxide layer 216b of FIG. 21. Also, the oxide layer 216b may be formed of other suitable dielectric materials other than oxide within the spirit and scope of the present invention.

Figure 4M:
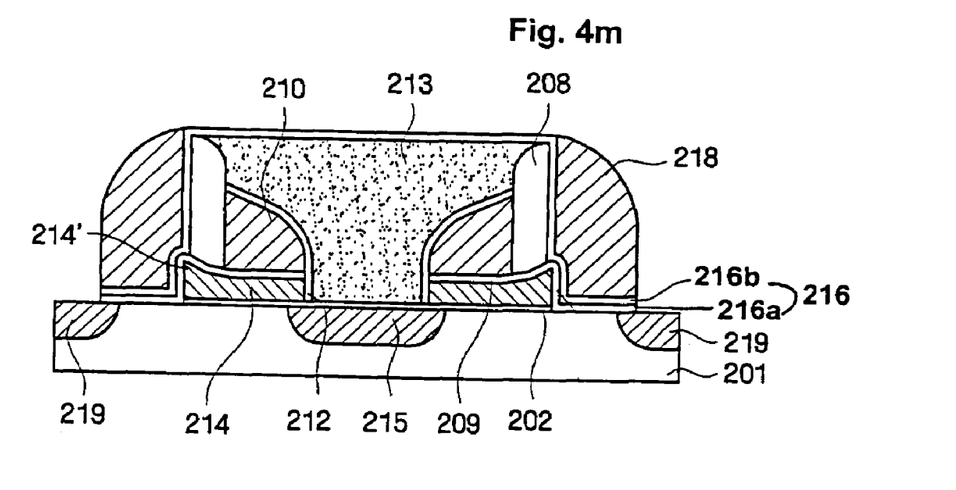

Referring to FIG. 4m, an erase gate layer (not shown) is deposited on the resultant structure of FIG. 4l. Preferably, the erase gate layer comprises polysilicon deposited to a thickness of about 1500 to about 3000 Å. The erase gate layer may then be etched using an anisotropic etching process or etched back to produce erase gates 218. The erase gates 218 may also be referred to as control gates. As shown in FIG. 4m, the erase gates 218 may have curved surfaces similar to those of the program gates 210 and the dielectric sidewalls 208. Thus, the erase gates 218 are formed self aligned with the shapes of the dielectric sidewall 208 and the floating gate 214 without using a photolithographic process. Thus, the device size can be substantially reduced, perhaps by about two thirds, compared to the prior art device. With the erase gate 218, data can be input to the memory unit cell 310 through the bit line 320 or the data stored in the unit cell 310 can be output to the bit line 320 during the program or read operations.

Following this process, an ion-implantation process is performed to create drain regions 219, where a portion of the drain regions are disposed directly beneath a portion of the erase gates 218.

Referring back to FIG. 3, after the drain regions 218 are formed, an interlayer dielectric layer 350 is deposited on the structure of FIG. 4m, and contact holes are formed in the interlayer dielectric layer to expose the drain regions 219. Subsequently, a bit line 320 is formed to contact the drain regions 219 through the contact holes in the interlayer insulation layer 350.

As shown in FIG. 3, a vertical distance $d_1$ from the bottom of the floating gate 214 to the top of the erase gate 218 is greater than a vertical distance $d_2$ from the bottom of the floating gate 214 to the top of the program gate 210.

The thickness of the tunneling dielectric layer 216 is also greater than the thickness of the coupling dielectric layer 209.

The invention may be practiced in many ways. What follows are exemplary, non-limiting descriptions of some embodiments of the invention.

According to some embodiments of the present invention, as shown in FIG. 3, a semiconductor device comprises a semiconductor substrate 201 having a first junction region 215 and a second junction region 219. The device further includes an insulated floating gate 214 disposed on the substrate 201, the floating gate 214 at least partially overlapping the first junction region 215, an insulated program gate 210 disposed on the floating gate 214, the program gate 210 having a curved upper surface; and an insulated erase gate 218 disposed on the substrate 201 and adjacent the floating gate 214, the erase gate partially overlapping the second junction region 219.

According to some embodiments, the erase gate 218 has a curved upper surface.

According to some embodiments, the insulated program gate 210 has an etched-back spacer shape.

According to some embodiments, the insulated erase gate 218 has an etched-back spacer shape.

According to some embodiments, the floating gate 214 has a protruded outer edge or tip 214' proximate the erase gate 218.

According to some embodiments, a coupling dielectric layer 209 is interposed between the floating gate 214 and the program gate 210 and a tunneling dielectric layer 216 is interposed between the floating gate 214 and the erase gate 218. The tunneling dielectric layer 216 is thicker than the coupling dielectric layer 209.

According to some embodiments, a substantially vertical surface of the program gate 210 is aligned or substantially parallel with a substantially vertical surface of the floating gate 214.

According to some embodiments, a dielectric sidewall 208 is disposed between the erase gate 218 and the program gate 210. The dielectric sidewall may be thicker than the coupling dielectric layer 209. Preferably, the dielectric sidewall is about 500 to about 1500 Å thick.

According to some embodiments, an upper part of the erase gate 218 extends higher than an upper part of the program gate 210.

Table 1, which is found immediately below this paragraph, illustrates typical operational voltage levels that are applied to the EEPROM unit cells of FIG. 3 for different modes of the device.

TABLE 1

|  | Erase gate 218 | Program Gate 210 | Common source region 215 | Drain regions 219 |
|---|---|---|---|---|
| Write (charge) | $V_{th}$ | 5~10 V | 3~6 V | 0 V |
| Erase (discharge) | 10~13 V | 0 V | 0 V | 0 V |
| Read | 1~2 V | 1~2 V | 0 V | 0.4~1 V |

As illustrated in Table 1, during a write (charge) operation, a voltage of $V_{th}$, for example, about 1.5 V, may be applied to the erase gate 218. A voltage of up to about 10 V may be applied to the program gate 210. Accordingly, hot electrons generated from the drain region 219 move toward the common source region 215 and accumulate in the floating gate 214 after passing through the gate dielectric layer 202.

Because the tunneling dielectric layer 216 between the floating gate 214 and the erase gate 218 is thicker than the coupling dielectric layer 209 between the floating gate 214 and the program gate 210, the electric field between the program gate 210 and the floating gate 214 is greater than that between the erase gate 218 and the floating gate 214. The voltage of the floating gate 214 may be reduced as the erase gate 218 will give the floating gate 214 the erase gate voltage coincidentally.

During an erase (discharge) operation, a voltage of about 10 to 13 V is applied to the erase gate 218, and the program gate 210, the source region 215, and the drain regions 219 are all at approximately 0 V. As a result, during the erase operation, the electrons accumulated in the floating gate 214 can be discharged to the erase gate 218 through the tunneling dielectric layer 216 by an F-N tunneling process due to the high voltage, e.g., 10-13 applied in the erase gate 218. In particular, if the capacitive coupling ratio between the floating gate 214 and the erase gate 218 is lower, a relatively lower voltage is induced into the floating gate 214 such that the electrons accumulated in the floating gate 214 can be more effectively discharged through the tunneling dielectric layer 216 by the F-N tunneling process. Likewise, during the write operation, if the capacitive coupling ratio between the program gate 210 and the floating gate 214 is higher, a relatively higher voltage is induced in the floating gate 214 such that the electrons can be injected in the floating gate 214 more effectively through the gate dielectric layer 202. For these reasons, a higher coupling ratio is more desirable during the write operation and a lower coupling ratio is more desirable during the erase operation. According to an aspect of the present invention, even when the high voltage, e.g., 10-13 V, is applied to the erase gate 218, the coupling ratio can still be relatively low because the program gate 210 at the potential of 0 V disposed on the floating gate 214 reduces the coupling effect between the erase gate 218 and the floating gate 214. Therefore, even with a relatively lower voltage compared to the prior art, the erase operation can be successfully performed.

During a read operation, a voltage of about 1 to about 2 V is applied to the erase gate 218 and the program gate 210. The source region 215 has a voltage of about 0 V, and the drain regions 219 have a voltage of about 0.4 to 1 V.

Also, according to embodiments of the present invention, both the voltages, e.g., 3-6 V, applied to the junction regions and the voltages, e.g., 5-10 V, applied from the program gate 210 lead to coupling of the floating gate 210. Thus, the write operation can be performed with significantly lower voltages compared to the prior art because the coupling of the floating gate 214 needs not be relied solely on the high voltage such as 15 V applied to the junction regions. In other words, because the program gate 210 is disposed above the floating gate 214, the coupling ratio can be higher during the write operation. For this reason, the common source region 215 need not overlap the floating gate 214 to a large extent and the punchthrough between the memory cells can be prevented.

Figure 5:
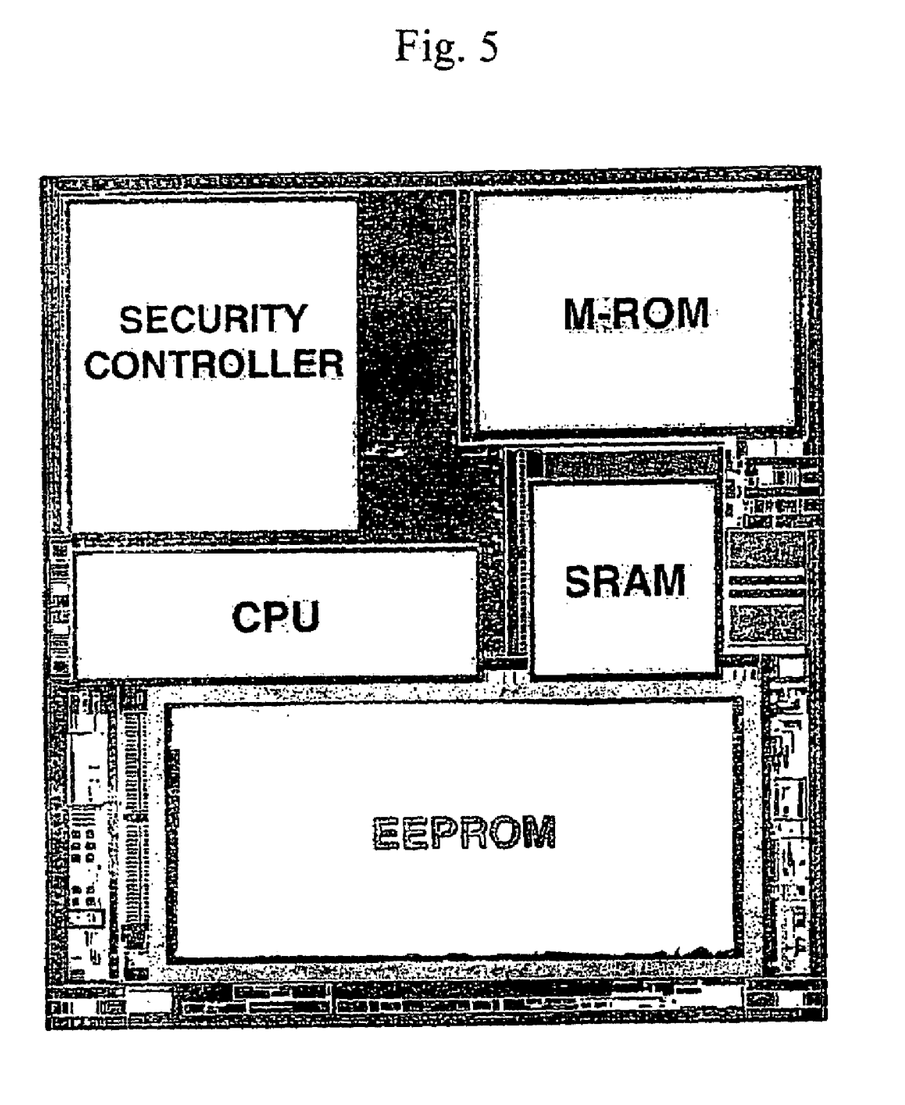
FIG. 5 is a schematic illustrating one exemplary data system employing non-volatile memory cells of the present invention.

As shown in FIG. 5, embodiments of the present invention can be applied to various electronic systems such as a memory module or a smart card as shown. The smart card may include, for example, a security controller for encryption and/or decryption, M-ROM including chip operation system (COS) and basic input output system (BIOS), SRAM for temporary memory, and a central processing unit (CPU) for chip or data control in addition to the non-volatile memory cell according to embodiments of the present invention.

In conclusion, according to one aspect of the present invention, because the erase gate 218 can be formed self-aligned with the floating gate 214 and/or the program gate 210, the device size can be significantly reduced and the process margins can be substantially increased compared to the prior art. Also, according to another aspect of the present invention, because there are no separate word lines that should be physically separated by a sufficient amount from sense lines, the size of the device can be significantly reduced. In addition, according to still another aspect of the present invention, not only voltages applied to the junction regions but also the voltages applied from the program gate 210 can result in coupling of the floating gate 210. Thus, the charge or discharge operations can be performed with a significantly lower voltage compared to the prior art. In other words, with embodiments of the present invention, high voltages that have been required in the prior art devices need not be applied to the junction regions, causing punch-through or disturbance between memory cells or to the eras gate 218. As a result, the prior art problems such as punch-through between the memory cells can be effectively prevented even when L, i.e., the distance between the common source region 215 and the drain 219 is reduced. Thus, the device can be further scaled down without the problems of program disturbance or punchthrough.

It should be appreciated that reference throughout this specification to "one embodiment" or "an embodiment" means that a particular feature, structure or characteristic described in connection with the embodiment is included in at least one embodiment of the present invention. Therefore, it should be emphasized and appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Having described and illustrated the principles of the invention in a several preferred embodiments, it should be apparent that the embodiments may be modified in arrangement and detail without departing from such principles. We claim all modifications and variation coming within the spirit and scope of the following claims.

The invention claimed is:

1. A method comprising:
    forming a gate dielectric layer on a substrate;
    forming a floating gate layer on the gate dielectric layer;
    forming a dielectric layer pattern on the floating gate layer, the dielectric layer pattern exposing a region of the floating gate layer;
    forming a first thermal oxide layer on the exposed region of the floating gate layer;
    removing the first thermal oxide layer from the floating gate layer;
    forming a dielectric sidewall on a sidewall of the dielectric layer pattern;
    forming a coupling dielectric layer on the exposed region of the floating gate layer;
    forming a program gate in contact with the coupling dielectric layer and the dielectric sidewall; and
    partially removing the coupling dielectric layer and the floating gate layer until a portion of the gate dielectric layer is exposed, thereby forming a trench region extending through the coupling dielectric layer and the floating gate layer.

2. The method of claim 1, wherein forming the gate dielectric layer comprises forming a thermal oxide to a thickness of about 50 to about 150 Å.

3. The method of claim 1, wherein forming the floating gate layer comprises depositing a polysilicon layer to a thickness of about 500 to about 1500 Å.

4. The method of claim 1, wherein forming a dielectric layer pattern comprises forming another dielectric layer on the floating gate layer and patterning the dielectric layer.

5. The method of claim 4, wherein forming another dielectric layer comprises depositing a nitride layer to a thickness of about 2000 to about 4000 Å.

6. The method of claim 1, further comprising forming another thermal oxide layer on the floating gate layer before forming the dielectric sidewall thereon.

7. The method of claim 6, wherein another thermal oxide layer is formed to a thickness of about 50 to about 150 Å.

8. The method of claim 1, wherein forming a thermal oxide layer comprises forming a thermal oxide to a thickness of about 500 to about 1500 Å.

9. The method of claim 1, wherein removing the first thermal oxide layer comprises wet etching.

10. The method of claim 1, wherein removing the first thermal oxide layer comprises forming a substantially rounded region of the floating gate layer adjacent to a sidewall of the dielectric layer pattern.

11. The method of claim 1, wherein forming the dielectric sidewall comprises:
    depositing a high temperature oxide; and
    anisotropically etching the high temperature oxide.

12. The method of claim 1, wherein the dielectric sidewall is about 500 to about 1500 Å thick.

13. The method of claim 1, wherein forming the program gate comprises:
    depositing polysilicon on the coupling dielectric layer; and
    anisotropically etching the deposited polysilicon without using a photolithographic process.

14. The method of claim 13, wherein the polysilicon is deposited to a thickness of about 1500 to about 3000 Å.

15. The method of claim 1, further comprising removing an upper portion of the program gate concurrently with partially removal of the coupling dielectric layer.

16. The method of claim 15, further comprising an optional thermal oxide layer that covers exposed surfaces of the program gate.

17. The method of claim 16, wherein the thickness of the optional thermal oxide layer is about 50 to about 150 Å.

18. The method of claim 1, wherein forming the coupling dielectric layer comprises using one selected from the group consisting of a thermal oxidation process, a high temperature oxide CVD process, and a combination of a thermal oxidation process and a medium temperature oxide CVD process.

19. The method of claim 1, further comprising:
ion implanting in the trench region to form a source region in the substrate;
depositing a dielectric material to fill the trench region and cover the dielectric layer pattern;
planarizing the dielectric material until the dielectric layer pattern is exposed; and
removing the dielectric layer pattern to expose a region of the floating gate layer.

20. The method of claim 19, wherein ion implanting comprises ion implanting the impurities at a dose of about $10^{15}$ ions/cm$^2$.

21. The method of claim 19, wherein depositing the dielectric material comprises depositing an oxide to a thickness of about 5000 to 10000 Å using a CVD process.

22. The method of claim 19, wherein removing the dielectric layer pattern comprises wet etching the dielectric layer pattern with phosphoric acid.

23. The method of claim 19, further comprising:
etching the floating gate layer to form a floating gate by using the dielectric material and the dielectric sidewall as a mask without using a photolithographic process.

24. The method of claim 23, wherein etching the floating gate layer comprises anisotropic dry etching.

25. The method of claim 23, further comprising:
removing a portion of the coupling dielectric layer above the floating gate and a portion of the gate dielectric layer below the floating gate to expose a tip of the floating gate;
forming a tunneling dielectric layer on the tip of the floating gate and a sidewall of the floating gate.

26. The method of claim 25, wherein forming the tunneling dielectric layer comprises forming a thermal oxide layer to a thickness of about 50 to about 150 Å.

27. The method of claim 25, further comprising:
forming an additional tunneling dielectric layer on the tunneling dielectric layer.

28. The method of claim 27, wherein forming the additional tunneling dielectric layer comprises using a CVD process.

29. The method of claim 25, further comprising:
forming an erase gate layer on the substrate;
etching the erase gate layer to form an erase gate with a curved upper surface; and
implanting ions beneath the erase gate layer to form a drain region.

30. The method of claim 29, wherein forming the erase gate layer comprises depositing a polysilicon layer to a thickness of about 150 to about 3000 Å.

31. The method of claim 29, wherein etching the erase gate layer comprises anisotropic dry etching without using a photolithographic process.

32. The method of claim 29, wherein the program gate includes a substantially vertical surface that is aligned with a substantially vertical surface of the floating gate.

33. The method of claim 29, wherein an upper part of the erase gate extends higher than an upper part of the program gate.

34. A method comprising:
forming a semiconductor substrate having a first junction region and a second junction region;
forming an insulated floating gate disposed on the substrate, the floating gate at least partially overlapping the first junction region;
forming an insulated program gate disposed on the floating gate, the program gate having a curved upper surface; and
forming an insulated erase gate disposed on the substrate and adjacent the floating gate, the erase gate partially overlapping the second junction region.

35. The method of claim 34, wherein forming an insulated erase gate comprises forming the insulated erase gate having a curved upper surface.

* * * * *

UNITED STATES PATENT AND TRADEMARK OFFICE
CERTIFICATE OF CORRECTION

PATENT NO. : 7,271,061 B2  Page 1 of 1
APPLICATION NO. : 11/187424
DATED : September 18, 2007
INVENTOR(S) : Hee-Seog Jeon et al.

It is certified that error appears in the above-identified patent and that said Letters Patent is hereby corrected as shown below:

Column 10, line 50, the words "claim 1" should read -- claim 11 --;
Column 12, line 15, the word "150" should read -- 1500 --.

Signed and Sealed this

Tenth Day of March, 2009

JOHN DOLL
*Acting Director of the United States Patent and Trademark Office*